United States Patent [19]
Holzworth et al.

[11] Patent Number: 5,493,147
[45] Date of Patent: Feb. 20, 1996

[54] ANTIFUSE CIRCUIT STRUCTURE FOR USE IN A FIELD PROGRAMMABLE GATE ARRAY AND METHOD OF MANUFACTURE THEREOF

[75] Inventors: Monta R. Holzworth, Santa Clara; Richard Klein, Mountain View; Pankaj Dixit, San Jose; William P. Ingram, III, Los Altos, all of Calif.

[73] Assignee: Crosspoint Solutions, Inc., Milpitas, Calif.

[21] Appl. No.: 319,765

[22] Filed: Oct. 7, 1994

Related U.S. Application Data

[63] Continuation of Ser. No. 41,924, Apr. 2, 1993, Pat. No. 5,384,481, which is a continuation of Ser. No. 642,617, Jan. 17, 1991, abandoned.

[51] Int. Cl.$^6$ .................................................. H01L 29/00
[52] U.S. Cl. ........................................... 257/530; 257/50
[58] Field of Search ...................... 257/530, 50; 437/922

[56] References Cited

U.S. PATENT DOCUMENTS

| | | |
|---|---|---|
| 3,571,673 | 3/1971 | Ovshinsky . |
| 3,675,090 | 7/1972 | Neale . |
| 4,177,473 | 12/1979 | Ovshinsky . |
| 4,217,374 | 8/1980 | Ovshinsky et al. ...................... 257/52 |
| 4,226,898 | 10/1980 | Ovshinsky et al. ...................... 257/52 |
| 4,424,579 | 1/1984 | Roesner . |
| 4,442,507 | 4/1984 | Roesner . |
| 4,458,297 | 7/1984 | Stopper et al. . |
| 4,499,557 | 2/1985 | Holmberg et al. . |
| 4,590,589 | 5/1986 | Gerzberg . |
| 4,599,705 | 7/1986 | Holmberg et al. . |
| 4,651,409 | 3/1987 | Ellsworth et al. . |
| 4,700,465 | 10/1987 | Sirkin . |
| 4,748,490 | 5/1988 | Hollingsworth . |
| 4,758,745 | 7/1988 | El Gamal et al. . |
| 4,786,904 | 11/1988 | Graham, III et al. . |
| 4,795,657 | 1/1989 | Formigoni et al. . |
| 4,796,074 | 1/1989 | Roesner . |
| 4,823,181 | 4/1989 | Mohsen et al. . |
| 4,839,859 | 6/1989 | Moopen et al. . |
| 4,845,045 | 7/1989 | Shacham et al. . |
| 4,847,732 | 7/1989 | Stopper et al. . |
| 4,873,459 | 10/1989 | El Gamal et al. . |
| 4,876,668 | 10/1989 | Thakoor et al. . |
| 4,881,114 | 11/1989 | Mohsen et al. . |
| 4,882,611 | 11/1989 | Blech et al. . |
| 4,899,205 | 2/1990 | Hamdy et al. . |
| 4,914,055 | 4/1990 | Gordon et al. . |
| 4,943,538 | 7/1990 | Mohsen et al. . |
| 5,008,855 | 4/1991 | Eltoukhy et al. . |
| 5,057,451 | 10/1991 | McCollum . |
| 5,070,384 | 12/1991 | McCollum et al. . |
| 5,083,083 | 1/1992 | El-Ayat et al. . |
| 5,181,096 | 1/1993 | Forouhi . |
| 5,210,598 | 5/1993 | Nakazaki et al. ........................ 257/530 |

OTHER PUBLICATIONS

G. H. Chapman et al. "A Laser Linking Process for Restructurable VLSI" *CLEO* '82 (Apr. 1982) 5 pages.

Cook et al., "Amorphous Silicon Antifuse Technology for Bipolar PROMs," *1986 Bipolar Circuits and Technology Meeting*, pp. 99–100.

*Primary Examiner*—J. Carroll
*Attorney, Agent, or Firm*—Richard T. Ogawa

[57] ABSTRACT

An antifuse structure particularly suitable for field programmable gate arrays is presented. In most present day processes the antifuse structure is formed with a refractory metal layer, amorphous silicon layer and refractory metal layer sandwiched between two metal interconnection lines. Unprogrammed resistances of very high values, programmed resistances of very low values, short programming times and desirable programming voltages are among the advantages realized.

17 Claims, 3 Drawing Sheets

ANTIFUSE CIRCUIT STRUCTURE FOR USE IN A FIELD PROGRAMMABLE GATE ARRAY AND METHOD OF MANUFACTURE THEREOF

CROSS-REFERENCE TO RELATED APPLICATIONS

This is a Rule 60 Continuation of U.S. Ser. No. 08/041,924, filed Apr. 2, 1993, now U.S. Pat. No. 5,384,481, which is a File Wrapper Continuation of U.S. Ser. No. 07/642,617, filed Jan. 17, 1991, now abandoned.

BACKGROUND OF THE INVENTION

The invention relates generally to the field of/ semiconductor devices, particularly to gate arrays and, more particularly, to user-programmable or field programmable gate arrays (FPGAs).

Gate arrays are largely a matrix of integrated circuit structures, such as logic gates and their associated input and output structures which are isolated from one another. These logic gates are overlaid with vertical and horizontal wiring channels, which interconnect the logic gates and input and output structures in a pattern to perform a user-specified function.

Conventional, or mask-programmable, gate arrays (MPGAs) are created by building the integrated circuit up to the interconnect level which is left unspecified for the user. After the interconnect pattern is specified by the user, the wiring channels are created by depositing, masking, and etching the metal interconnection layers and contact layers to connect the logic gates and input and output structures to perform the user-specified function. The creation of the wiring channels, i.e., the programming of the device, is done by the manufacturer of the MPGA. Disadvantages of MPGAs include the long period between the design and specification of the desired interconnect pattern and receipt of the completed device, and the large nonrecurring engineering cost involved in each design and specification iteration, making MPGAs uneconomical in small production volumes.

To address some of these problems, there is another type of gate array, the field programmable gate array (FPGA). The FPGA is completely formed with a global set of vertical and horizontal wiring channels which are built into the device. However, these channels are electrically isolated from the logic structures, the input and output structures, and each other, by electrically programmable interconnect structures known as antifuses. The user programs these antifuses to define the specified interconnection pattern for his application, very rapidly and at his own facility. The elapsed time from design specification to receipt of completed parts is measured in minutes instead of months, and the nonrecurring engineering cost is also avoided.

However, FPGAs heretofore have had certain disadvantages in performance and use. Ideally antifuse structures should have a very high resistance (to form essentially an open circuit) and low capacitance in the unprogrammed ("off") state, as well as a very low resistance (to form essentially a closed circuit) in the programmed ("on") state. Furthermore, antifuse structures should occupy minimal layout area, with very short programming times, and programming voltages which are not so high as to require additional process complexity to accommodate the high programming voltages. Because present antifuse structures do not meet all these requirements, FPGA have suffered in performance.

A more subtle disadvantage is that the performance of present day antifuse structures has required that the architecture of the FPGA be modified so that the FPGA, once programmed, does not behave like an identically-programmed MPGA. Because of the large numbers of users already familiar with the architecture and usage of MPGAs, it is desirable that the FPGA match a MPGA in gate density and performance. The electrical and physical characteristics of present antifuse structures impede progress toward a high-performance, low-cost FPGA, which matches MPGA performance levels.

The present invention solves or substantially mitigates many of these problems of present antifuses.

SUMMARY OF THE INVENTION

The present invention provides for an antifuse structure on a semiconductor substrate which is located in the upper parts of interconnection layers of an FPGA. The antifuse structure comprises a metal interconnection layer on an insulating layer, a first refractory metal layer on the metal interconnection layer, a layer of amorphous silicon on the first refractory metal layer, a second refractory metal layer on the amorphous silicon layer; and a subsequent metal interconnection layer on the second refractory metal layer. Typically in most semiconductor processes, the first metal layer is the interconnecting metal-1 layer and the second metal layer is the interconnecting metal-2 layer. However, the antifuse structure of the present invention can be located between any two metal interconnecting layers.

DETAILED DESCRIPTION OF SPECIFIC EMBODIMENTS

Figure 1:
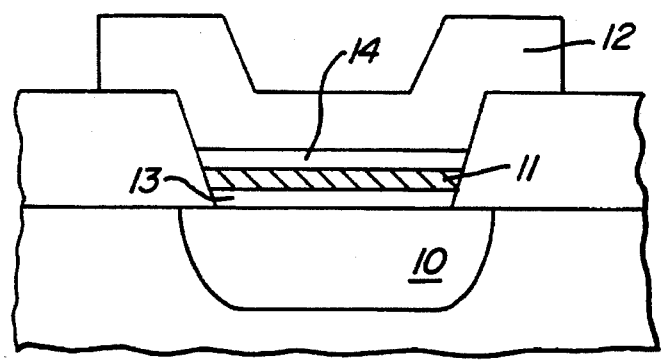
FIG. 1 is a cross-sectional diagram illustrating a typical antifuse structure in the prior art.

FIG 1 illustrates a typical antifuse structure found in present day FPGAs. The antifuse has two conductive layers 10 and 12, vertically separated by three thin dielectric layers 11, 13 and 14. The upper layer 12 is doped polysilicon and the lower layer 10 is heavily N-doped single-crystal silicon. The lower layer 10 is either part of the substrate in which the FPGA integrated circuit is formed, or part of a layer of epitaxial silicon which is deposited upon the substrate. The silicon nitride dielectric layer 11 is formed by chemical vapor deposition between the silicon dioxide dielectric layers 13 and 14 which are formed by thermal oxidation.

The antifuse operates so that when a sufficient programming voltage is placed between the two conductive layers 10 and 12, the dielectric layers 13, 11 and 14 rupture. The two conductive layers 10 and 12 are electrically joined, and the antifuse is programmed. Otherwise, the intact dielectric layers 13, 11 and 14 in their entirely form a high resistance path between the two layers 10 and 12.

Because the dielectric layers 11, 13 and 14 are typically quite thin, the capacitance of each antifuse is quite high, typically about 2.2 fF (femtoFarads) per square micron. This high capacitance is a serious drawback. Since relatively few antifuses in a FPGA are programmed in any given application, the remaining unprogrammed antifuses serve as parasitic capacitors, thus slowing performance. Additionally, this antifuse structure programs to a high $R_{ON}$ of approximately 1000 ohms, which increases parasitic resistance and further slows circuit performance.

The programming voltage is typically around 18 volts, a voltage which is high enough to require additional process complexity and layout area in order to achieve the necessary electrical protection of the logic structures, which operate at much lower voltages, typically 5 volts. Furthermore, programming each fuse requires some significant time, typically 100 milliseconds. These requirements result in a larger, costlier and lower performance part.

Another disadvantage of this antifuse structure results from the fact that the antifuse structure must be between the semiconductor substrate (or an epitaxial layer in contact with the substrate) and a polysilicon layer above. Of necessity, the antifuse structure must lie to the side of the active elements, i.e., the transistors, of the FPGA circuits. More layout space is required.

Thus an FPGA using this type of antifuse structure cannot fully match the functions of an MPGA. The antifuse structure has poor characteristics with which an FPGA can match MPGA performance. $R_{ON}$ is undesirably high and parasitic capacitance is high. These slow the performance of the circuits in the FPGA. Furthermore, programming voltages are high and programming times are long. Processing complexity is increased and manufacturing costs are raised. Finally, the increased size of such a FPGA also raises the costs of production and lowers the speed of the FPGA.

The result is that, for most applications, the MPGA is more feasible economically and in performance. The FPGA remains as a specialized product in the larger MPGA market.

Figure 2:
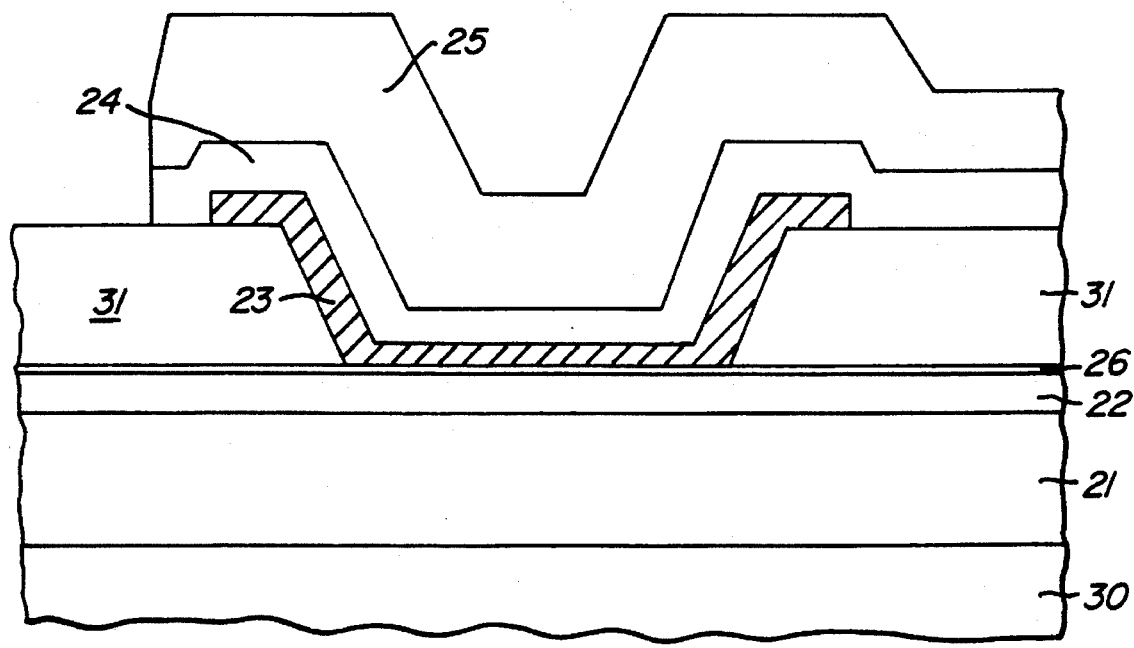
FIG. 2 is a cross-sectional diagram illustrating a specific embodiment of the antifuse structure of the present invention.

FIG. 2 illustrates one embodiment of an antifuse structure according to the present invention. The antifuse lies between two metal interconnection layers 21 and 25 located above the surface of the integrated circuit substrate. Typically these metal interconnection layers are formed from aluminum alloys. As contemplated by the present invention, the antifuse structure may be formed between any two metal interconnection layers. In a double-metal process, for example, these layers 21 and 25 are the metal-1 and metal-2 layers.

Sandwiched between the layers 21 and 25 are a first layer 22 of refractory metal in contact with the lower metal layer 21, a layer 23 of semiconductor material, amorphous silicon, and a second refractory metal layer 24 in contact with the upper metal layer 25. While the term, "refractory metal," is used with respect to the layers 22 and 24, the term is meant to encompass refractory metals, their intermetallics, alloys, silicides, nitrides and combinations thereof, which may be used for the layers 22 and 24. An example of a metal which may be used is tungsten, but it has been found that an alloy of titanium and tungsten (TiW) is more suitable for the layers 22 and 24.

These refractory metal layers 22 and 24 respectively contact the lower and upper surfaces of the amorphous silicon layer 23 which is formed with a thickness of approximately 800 Angstroms. The amorphous silicon layer 23 acts as a high-resistance barrier between the conducting layers 21 and 25 unless the antifuse structure is programmed. When the antifuse structure is programmed, the amorphous silicon layer 23 is ruptured and a very low resistance contact is formed between the interconnection layers 21 and 25.

Thus the antifuse structure has many desirable operating characteristics. For example, the antifuse structure has typically a high unprogrammed resistance of $1 \times 10^9 \Omega$, a low programmed resistance ($R_{ON}$) of 100 ohms, a low programming voltage of 8 volts, and a short programming time of typically 100 microseconds. The antifuse structure can be programmed quickly and at a low voltage, compared to previous antifuse structures. Furthermore, with further process refinements, it is believed that programmed resistances of less than 100 ohms are possible.

An advantage of low programming voltage is the avoidance of additional process complexity. This allows the antifuse to be manufactured with or adapted to most standard processes, including those in CMOS, BiCMOS, NMOS and bipolar technologies. With the antifuse structure of the present invention, the resistance and capacitance of the unprogrammed antifuse are respectively high enough and low enough to minimize circuit performance degradation due to parasitic effects. On the other hand, the resistance of the programmed antifuse is low enough not to significantly impede circuit performance.

Another advantage of the antifuse structure of the present invention is that the antifuse structures are implemented in the upper interconnection layers, i.e., between the metal layers, for the integrated circuit forming the FPGA. This allows the antifuses to be placed directly above the programming and logic transistors in the substrate of the integrated circuit. A great deal of layout area, typically over 50%, is saved compared to present day FPGAs. Furthermore, the vertical placement of the antifuses shortens the length of conduction lines which lowers circuit series resistance. Hence a much larger effective gate count can be achieved for the FPGA and an MPGA-compatible FPGA is possible, with all of its attendant advantages.

Figure 3A:
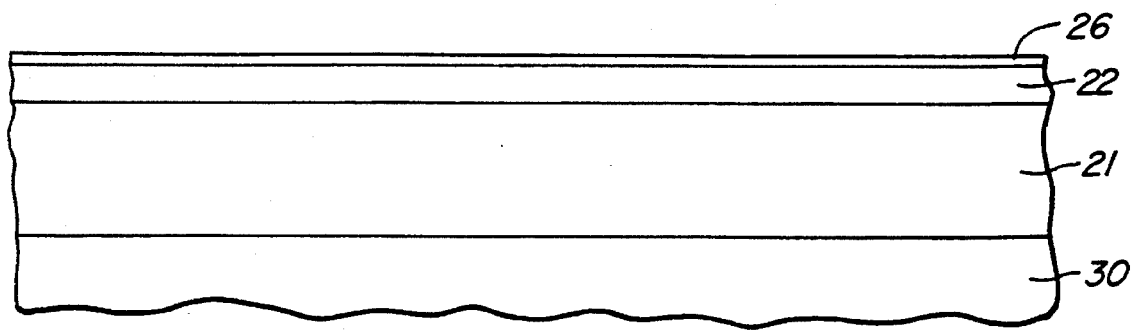
FIG. 3A–3C show the sequence of steps used to manufacture the antifuse structure of FIG. 2.
Figure 3B:
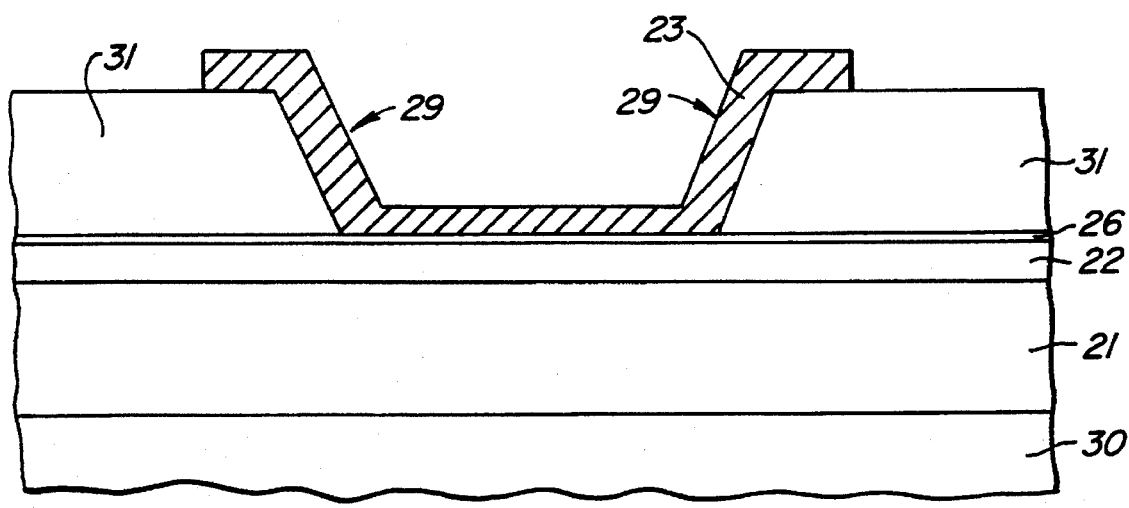
Figure 3C:
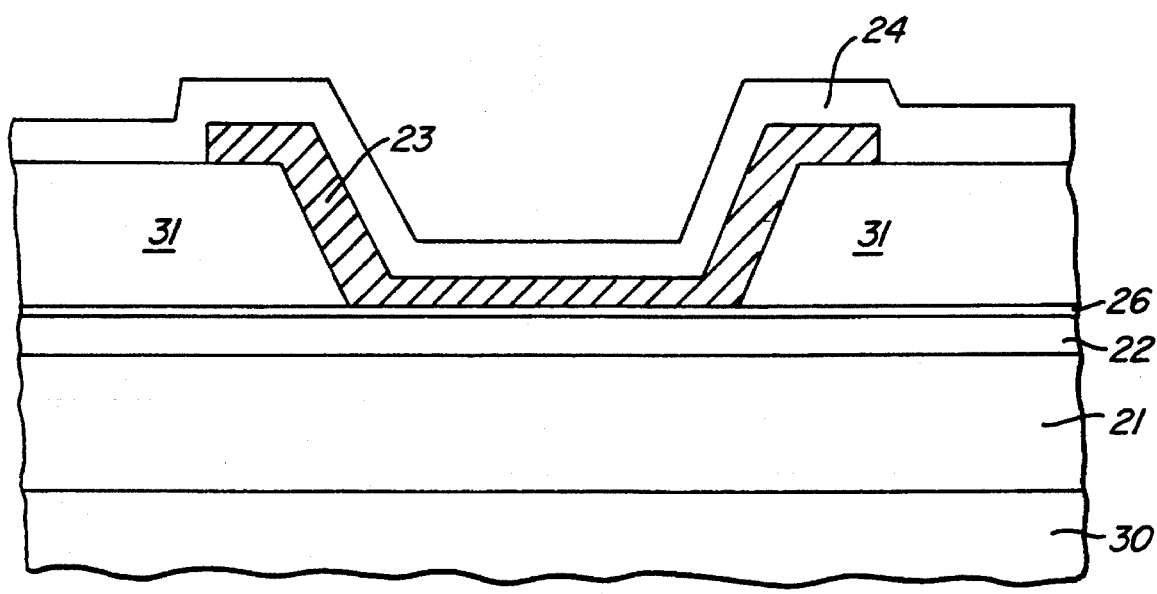

FIGS. 3A to 3C shows the steps in manufacturing the antifuse structure of the present invention. FIG. 3A shows the step in the manufacturing process after the transistors and other circuit structures have been created in the substrate and one or more polysilicon layers with intermediate insulating silicon dioxide layers have been deposited and defined.

As shown in FIG. 3A, a representative layer 30 of silicon dioxide is deposited over the substrate. Through standard masking and etching procedures, apertures are created in the layer 30. Then the metal layer 21 of aluminum is deposited. This is followed by the layer 22 of titanium-tungsten (TiW) alloy of 1000 Angstroms thickness. A deposited layer 26 of amorphous silicon or a refractor metal silicide, such as molybdenum silicide (MoSi), follows on the layer 22. The purpose of this layer 26 is explained below.

Then the layers 21, 22 and 26 are masked and etched by standard semiconductor processing techniques. In particular, the metal layers 21 and 22 are in physical and electrical contact to various points in the underlying parts of the integrated circuit through the apertures in the insulating layer 30.

After the layers 21, 22 and 26 are deposited and defined, another insulating layer 31 of silicon dioxide is deposited over the substrate and the layers 21, 22 and 26. A contact hole 29 is formed in the silicon dioxide layer 31 where an antifuse is desired by conventional masking and etching procedures.

The contact hole 29 is created by etching the silicon dioxide layer 31 by plasma etching using a fluorinated species. Due to the uneven heights in the silicon dioxide layer 31 in the regions where the contact holes 29 are located, it is desirable to overetch the contact holes 29 to ensure that all the holes 29 are properly formed. However, the plasma etch with a fluorinated species also etches the refractory metal layer 22 underlying the silicon dioxide layer 31. An overetch creates the strong possibility that the refractory metal layer 22 in some of the contact holes 29 will be removed completely.

The layer 26 acts as an etch stop layer to protect the refractory metal layer 22 from the overetch step. Since the plasma etch process using a fluorinated species has a higher selectivity toward silicon dioxide and the refractory metals in contrast to silicon and metal silicides, the layer 26 may be relatively thin, approximately 200 Angstroms, to be an effective etch stop. It should be noted that if the layer 22 is formed by a metal silicide, then the etch stop layer 26 is not required.

Then a semiconductor material layer 23 of amorphous silicon is deposited and defined by standard masking and etching steps so that a portion of the layer 23 covers the contact hole 29. The amorphous silicon may be doped or undoped. A thickness in the range of 500 to 1500 Angstroms has been found to work quite well in the antifuse structure, with an thickness of approximately 800 Angstroms being optimal. The results are shown in FIG. 3B.

To ensure the integrity and reliability of the layer 21, the deposition of the amorphous silicon layer 23 should be performed at temperatures below 450 degrees C. Plasma-enhanced chemical vapor deposition (PECVD) and sputter deposition may be used to deposit amorphous silicon at such comparatively low temperatures. Presently most amorphous silicon is deposited by low pressure chemical vapor deposition (LPCVD) at temperatures of about 550 degrees C.

Furthermore, it is important that the hydrogen content of the amorphous silicon layer 23 be kept in the range of 10–20% by composition so that the layer 23 has the optimum characteristics suitable for an antifuse. In the PECVD process, which uses silane and argon, this is achieved by increasing the flow of the inert gas, argon, over its nominal flow rate in the process or adjusting the temperature of deposition.

As shown in FIG. 3C, a second layer 24 of the titanium-tungsten (TiW) alloy of 1000 Angstroms thickness is deposited. This is followed by the deposition of the second interconnecting aluminum layer 25. Both metal layers 24 and 25 are then defined by standard masking and etching techniques. The completed antifuse structure is illustrated in FIG. 2.

It should be noted that the antifuse structure of the present invention is readily adaptable to emerging semiconductor processes in which the material of the metal interconnection layers, aluminum alloys, is substituted by other conducting material, such as a refractory metal or refractory metal alloy. In such a substitution, for example, the layer 21 is formed from a refractory metal, the intervening refractory metal layer 22 separating the layer 21 from the amorphous silicon layer 23 is no longer required. Similarly the intervening refractory metal layer 24 is not required if the interconnection layer 25 is formed from a refractory metal or a refractory metal alloy.

Thus an antifuse structure of metal layer, amorphous silicon and metal layer can be formed if both metal interconnection layers are formed from refractory metals or refractory metal alloys. Another structure is one with a metal layer, amorphous silicon, refractory metal, then followed by a layer of aluminum alloy if only the bottom metal interconnection layer is formed from a refractory metal or refractory metal alloy. Other combinations with refractory metal or alloy substitutions are possible.

The process described with respect to FIGS. 3A–3C is readily adapted to refractory metal substitution for the metal interconnection layers. The process becomes simpler. Furthermore, if a process similar to that described with respect to FIGS. 3A–3C is adapted with the lower interconnection layer 21 formed from a refractory metal or refractory metal alloy, a thin silicon-containing layer, such as layer 26, is still useful as an etch stop layer as protection in the contact hole etching step.

While the above is a complete description of the preferred embodiments of the invention, various alternatives, modifications and equivalents may be used. It should be evident that the present invention is equally applicable by making appropriate modifications to the embodiments described above. For example, if the locations for the antifuse structures are selected where the silicon dioxide layer 31 is always even, then it is possible that an overetch of the contact holes 29 and the etch stop layer 26 are not required. The etch stop layer 26 may also be eliminated if the layer 22 is formed by a metal silicide. Therefore, the above description should not be taken as limiting the scope of the invention which is defined by the appended claims.

What is claimed is:

1. An antifuse structure in an integrated circuit device, said integrated circuit device formed within and on a semiconductor substrate, said antifuse structure comprising a first metal layer on a first insulating layer over said substrate;

a first refractory metal layer on said first metal layer;

a relatively thin layer having silicon on said first refractory metal layer;

an amorphous silicon layer on said relatively thin layer, said amorphous silicon ranging from 500 to 800 Angstroms thick;

a second refractory metal layer on and in contact with said amorphous silicon layer; and a second metal layer on said second refractory metal layer;

wherein said antifuse structure includes an on-state program resistance of about 100 ohms or less, and a programming time of about 100 microseconds or less.

2. An antifuse structure as in claim 1 wherein said relatively thin layer is approximately 200 Angstroms thick.

3. An antifuse structure as in claim 1 wherein said relatively thin layer comprises amorphous silicon.

4. An antifuse structure as in claim 1 wherein said amorphous silicon layer is approximately 800 Angstroms thick.

5. An antifuse structure as in claim 1 wherein said amorphous silicon layer comprises hydrogen in the range of 10 to 20% by composition.

6. An antifuse structure as in claim 1 wherein at least one of said refractory metal layers comprise a titanium-tungsten alloy.

7. An antifuse structure as in claim 1 wherein said first and second metal layers comprise aluminum.

8. An antifuse structure as in claim 7 wherein at least one of said refractory metal layers comprise a titanium-tungsten alloy.

9. An antifuse structure in an integrated circuit device, said integrated circuit device formed within and on a semiconductor substrate, said antifuse structure comprising a refractory metal interconnection layer on a first insulating layer over said substrate;

a relatively thin layer having silicon on said refractory metal interconnection layer;

a dielectric layer overlying said relatively thin layer having silicon, said dielectric layer comprising an aperture therein, said aperture comprising aperture sides and an region exposing a portion of said relatively thin layer;

an amorphous silicon layer on said relatively thin layer portion and said aperture sides; and a second metal interconnection layer on and in contact with said amorphous silicon layer.

10. An antifuse structure as in claim 9 wherein said relatively thin layer is approximately 200 Angstroms thick.

11. An antifuse structure as in claim 9 wherein said amorphous silicon layer is approximately 800 Angstroms thick.

12. An antifuse structure as in claim 9 wherein said amorphous silicon layer comprises hydrogen in the range of 10 to 20% by composition.

13. The antifuse structure of claim 9 wherein said relatively thin layer comprises amorphous silicon.

14. The antifuse structure of claim 9 wherein said refractory metal interconnection layer comprises titanium alloy.

15. The antifuse structure of claim 9 wherein said second metal interconnection layer comprises an aluminum layer.

16. The antifuse structure of claim 9 wherein said relatively thin layer comprises silicide.

17. The antifuse structure of claim 9 wherein said antifuse includes a on-state program resistance of about 100 ohms or less.

* * * * *